United States Patent [19]

Ryat

[11] Patent Number: 5,349,304
[45] Date of Patent: Sep. 20, 1994

US005349304A

[54] OPERATIONAL AMPLIFIER HAVING MULTIPLE POSITIVE INPUTS

[75] Inventor: Marc H. Ryat, Fort Collins, Colo.

[73] Assignee: SGS-Thomson Microelectronics, Inc., Carrollton, Tex.

[21] Appl. No.: 17,672

[22] Filed: Feb. 12, 1993

[51] Int. Cl.[5] .................... H03F 3/45; H03F 3/50; H03F 3/345; H03K 5/00
[52] U.S. Cl. .................... 330/253; 330/257; 330/135; 330/277
[58] Field of Search ............ 350/257, 253, 135, 277

[56] References Cited

U.S. PATENT DOCUMENTS

| | | |
|---|---|---|
| 3,822,408 | 7/1974 | Veranth . |
| 4,502,013 | 2/1985 | Usui . |
| 4,564,814 | 1/1986 | Miura et al. . |
| 4,709,216 | 11/1987 | Davis . |
| 5,067,045 | 11/1991 | Schweiger . |
| 5,089,723 | 2/1992 | Davis et al. . |
| 5,093,634 | 3/1992 | Khoury . |
| 5,136,258 | 8/1992 | Nicollini et al. . |
| 5,142,244 | 8/1992 | Glica et al. . |
| 5,162,735 | 11/1992 | Okamoto . |
| 5,162,749 | 10/1992 | Kobayashi .......... 330/253 |

FOREIGN PATENT DOCUMENTS 0098810 5/1987 Japan .................. 330/277

OTHER PUBLICATIONS

J. Millman, "Microelectronics", McGraw-Hill, 1979, pp. 594–595.
C. J. Savant et al., "Electronic Circuit Design", Benjamin/Cummings, pp. 539–554.
"Amplifier Applications Guide", Analog Devices, 1992, pp. x–16–17.
Venugopal et al., "Design Considerations for High-Frequency Continuous-Time Filters and Implementation of an Antialiasing Filter for Digital Video", IEEE Journal of Solid-State Circuits, vol. 25, No. 6, Dec. 1990, pp. 1368–1378.

*Primary Examiner*—William L. Sikes
*Assistant Examiner*—Fetsum Abraham
*Attorney, Agent, or Firm*—Richard A. Bachand; Rodney M. Anderson; Lisa K. Jorgenson

[57] ABSTRACT

An operational amplifier input stage has at least two positive input transistors and one negative input transistor for providing more accurate and efficient limiting or rectification in limiter and rectifier circuits. The two positive input transistors are connected in parallel having a common drain connected to one side of a load and the negative input transistor's drain is connected to the other side of the load. The sources of all transistors are connected to a common node which is connected to a constant current source. This arrangement enables simplistic high accuracy limiting and rectifier circuits, having a reduced number of extrinsic components, thereby reducing unwanted speed limitations, to be realized. The operational amplifier input stage is also very useful in low supply circuit applications.

26 Claims, 5 Drawing Sheets

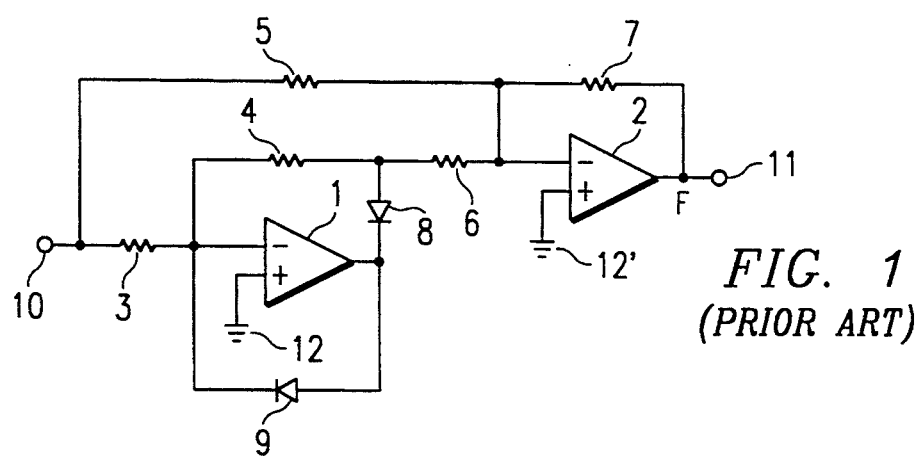
FIG. 1 (PRIOR ART)
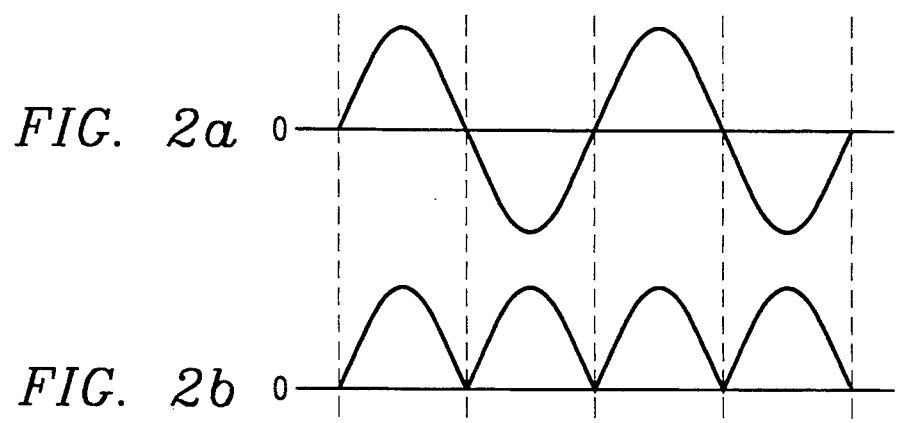
FIG. 2a
FIG. 2b
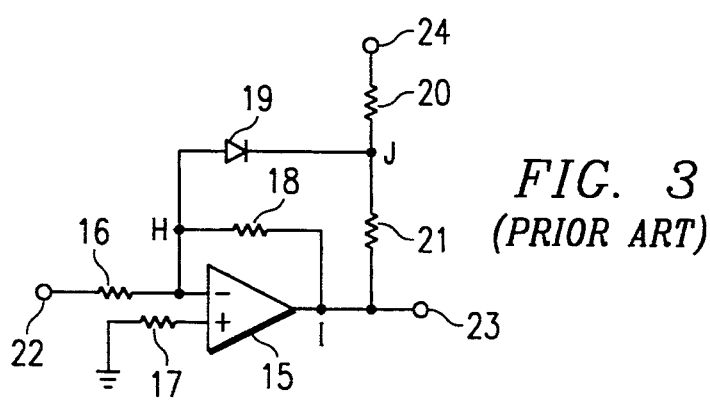
FIG. 3 (PRIOR ART)
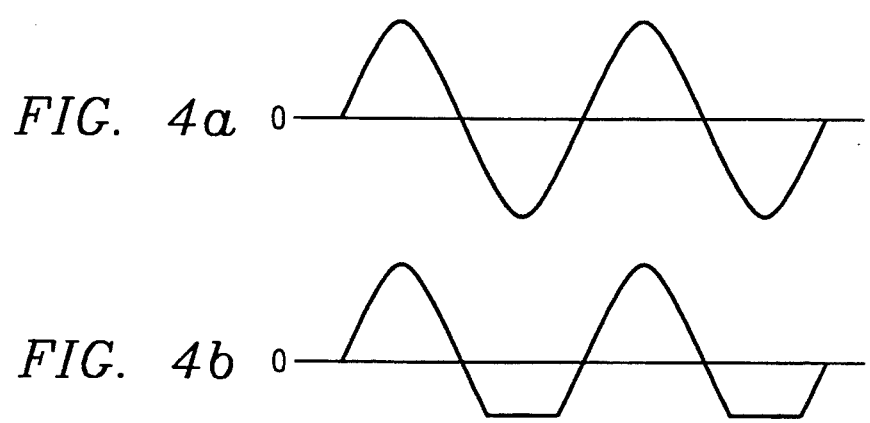
FIG. 4a
FIG. 4b

OPERATIONAL AMPLIFIER HAVING MULTIPLE POSITIVE INPUTS

FIELD OF THE INVENTION

The present invention relates to an improved operational amplifier for use in rectifier and limiter circuits, and in particular, to full-wave rectifier, maximum limiter and minimum limiter circuits.

BACKGROUND OF THE INVENTION

Conventional operational amplifiers have a differential input stage driven by a positive (non-inverting) and a negative (inverting) input connected to an output stage. Direct-coupled high gain amplifiers of this type are typically used in a feedback loop to implement a given function determined by extrinsic discrete components such as, for example, resistors and diodes. Operational amplifiers, properly configured, can even perform many mathematical operations, thus the name operational amplifier. In addition, operational amplifier circuits can be configured using external discrete components, either singly or in combination to generate specific output signals. Among these configurations, two of the most important and useful are limiters and rectifiers.

Prior art full-wave rectifiers generally use two operational amplifiers as shown in FIG. 1. More specifically, a resistor 3, a resistor 4 and the cathode of a diode 9 are connected to an inverting input of an operational amplifier 1 whose non-inverting input is connected to a reference potential point 12. The other end of the resistor 3 is connected to an input terminal 10 and to a resistor 5; and the other end of the resistor 4 is connected to the anode of a diode 8 and to a resistor 6. The cathode of the diode 8 is connected to the output of the operational amplifier 1 and to the anode of diode 9; and the other end of the resistor 6 is connected to an inverting input of an operational amplifier 2 and to a resistor 7. The non-inverting input of the operational amplifier 2 is connected to a reference potential 12'. The other end of the resistor 7 is connected to the output of the operational amplifier 2 and to an output terminal 11.

The operation of the rectifier in the prior art will now be discussed. When a positive input voltage $V_{INA}$ is applied to the input terminal 10, the diode 8 is rendered conductive and the diode 9 is rendered nonconductive. The operational amplifier 1 operates as a feedback amplifier having an amplification factor defined by resistors 3 and 4. If the resistances of the resistors 3 and 4 are denoted by $R_3$ and $R_4$, the output voltage $V_{OUTD}$ at the point D is given by the following equation (1), $$V_{OUTD} = -\frac{R_4}{R_3} \times V_{INA} \quad (1)$$

Here the electric currents flowing through the resistors 5, 6 and 7 are denoted by $I_5$, $I_6$ and $I_7$. If operational amplifiers 1 and 2 have infinitely great input impedances and, since the potentials at the inputs B and E of the operational amplifiers 1 and 2 can be assumed to be the same as the reference potential, the electric currents $I_5$ and $I_6$ are given by the following equations (2) and (3), $$I_5 = \frac{V_{INA}}{R_5} \quad (2)$$

$$I_6 = \frac{V_{OUTD}}{R_6} \quad (3)$$

where $R_5$ and $R_6$ denote resistances of the resistors 5 and 6.

Furthermore, the following equation (4) holds true among the electric currents $I_5$, $I_6$ and $I_7$, $$I_7 = I_5 + I_6 \quad (4)$$

If the equations (2) and (3) are substituted for the equation (4), the current $I_7$ is given by the equation (5), $$I_7 = \frac{V_{INA}}{R_5} + \frac{V_{OUTD}}{R_6} \quad (5)$$

If the equation (1) is substituted for the equation (5), the current $I_7$ is given by the equation (6), $$I_7 = \frac{V_{INA}}{R_5} + \frac{1}{R_6} \times \left[ -\frac{R_4}{R_3} \times V_{INA} \right] = \left[ \frac{1}{R_5} - \frac{R_4}{R_3 \times R_6} \right] \times V_{INA} \quad (6)$$

Here, if the output voltage at the output point F of the operational amplifier 2 is denoted by $V_{OUTF1}$ and the resistance of the resistor 7 by $R_7$, the voltage $V_{OUTF1}$ at the output point F is expressed by the equation (7), $$V_{OUTF1} = R_7 \times I_7 \quad (7)$$

Hence, if the equation (6) is substituted for the equation (7), there holds the following equation (8), $$V_{OUTF1} = -R_7 \times \left[ \frac{1}{R_5} - \frac{R_4}{R_3 \times R_6} \right] \times V_{INA} = R_7 \times \left[ \frac{R_4}{R_3 \times R_6} - \frac{1}{R_5} \right] \times V_{INA} \quad (8)$$

If the following equations (9) and (10) hold, the equation (8) can be replaced by the equation (11), $$R_3 = R_4 = R_6 = R \quad (9)$$
$$R_5 = R_7 = 2R \quad (10)$$

$$V_{OUTF1} = R_7 \times \left[ \frac{R_4}{R_3 \times R_6} - \frac{1}{R_5} \right] \times V_{INA} \quad (11)$$
$$= 2R \times \left[ \frac{R}{R \times R} - \frac{1}{2R} \right] \times V_{INA}$$
$$= 2R \times \frac{1}{2R} \times V_{INA}$$
$$V_{OUTF1} = V_{INA}$$

Therefore, when a positive input voltage $V_{INA}$ is applied to the input terminal 10, the same positive input voltage $V_{INA}$ appears on the output point F of the operational amplifier 2, i.e., appears on the output terminal 11, provided the above-mentioned resistances are set according to equations (9) and (10).

Next, when a negative input voltage $V'_{INA} = -V_{INA}$ is applied to the terminal 10, the diode 8 is rendered nonconductive, and the diode 9 is rendered conductive. Consequently, the potential becomes zero at the point D, resulting in no voltage drop across the resistor 6, i.e., both terminals of the resistor 6 are held at the reference potential, and no current flows through the resistor 6.

From the equations (4) and (5), therefore, the equation (12) holds true.

$$I_7 = I_5 + I_6 \qquad (12)$$
$$= I_5 (\because I_6 = 0)$$
$$= -\frac{V_{INA}}{R_5}$$

Therefore, the output voltage $V_{OUTF2}$ at the output point F of the operational amplifier 2 is given by the equation (13), $$V_{OUT2} = -R_7 \times I_7 \qquad (13)$$
$$= -R_7 \times \left[ -\frac{V_{INA}}{R_5} \right]$$
$$= \frac{R_7}{R_5} \times V_{INA}$$

Hence, if the equation (10) holds, the equation (13) is rewritten as, $$V_{OUTF2} = \frac{2R}{2R} \times V_{INA} \qquad (14)$$
$$= V_{INA}$$

Therefore, when the negative input voltage $V'_{INA}$ ($-V_{INA}$) is applied to the input terminal 10, a voltage of the same voltage level but having an inverted sign, i.e., the voltage $V_{INA}$, is obtained from the output point F of the operational amplifier or from the output terminal 11.

Thus, the circuit of FIG. 1 operates as an absolute value circuit which always produces output voltages of positive polarity upon receipt of input voltages of both positive and negative polarities. That is, when signals of sinusoidal waveform, such as shown in FIG. 2(a) are input to the input terminal 10, the output terminal 11 produces signals in which the positive portions of the input sinusoidal waves are output in their original form while the negative portions are output after they are inverted to positive portions as shown in FIG. 2(b). In other words, the circuit in the prior art operates as a full-wave rectifier. The conventional rectifier circuit shown in FIG. 1, however, requires five resistors having accurate resistances, two diodes and two operational amplifiers, i.e., two amplifier circuits, and further must satisfy the requirements of equations (9) and (10) for the five resistors. To realize a rectifying circuit, therefore, a considerable number of elements must be used, and it is necessary to maintain very high accuracy in the resistance values of the five resistors. Moreover, the speed of the circuit shown in FIG. 1 is limited due to the usually problematic recovery time of the diodes and the operational amplifier slew rates when the input signal changes sign.

Conventional prior art limiter circuits are also susceptible to the problems described above. A limiter, in its ideal basic form, constrains a signal to be below or above a particular specified value or breakpoint. The output signal is proportional to the input below (or above) this breakpoint and stays constant for inputs above (or below) this value.

An example of a prior art lower limit limiter circuit is shown in FIG. 3. The operation of this circuit will be described with reference to the components and circuit shown in FIG. 3. Due to the presence of the diode 19, connected between points H and J, this circuit is analyzed by considering the operation of two cases: the first is when the diode 19 is assumed to be an open circuit; and the second is when the diode 19 is considered to be a short circuit.

When the diode 19 in the circuit shown by FIG. 3 is not conducting, the circuit operates as an inverting amplifier with the output given by equation (15), $$v_o = -v_{ix}(R_f/R_A) \qquad (15)$$

where the resistors $R_F$ and $R_A$ correspond to resistors 18 and 16 respectively, the gain is $-R_F/R_A$. To find the breakpoint, we must solve for $v_1$ as follows:

$$v_1 = \frac{V_{ref} - v_o}{R_1 + R_2} R_2 + \qquad (16)$$

$$v_o = \frac{R_2 V_{reff} + R_1 v_o}{R_1 + R_2} = (R_1 \| R_2) \left[ \frac{V_{ref}}{R_1} + \frac{v_o}{R_2} \right]$$

where $V_{ref}$ is limiting reference voltage input at point 24, and $v_o$ is the output voltage measured at point 23 and $R_1$ and $R_2$ correspond to resistors 20 and 21 respectively.

The diode 19 conducts when $v_1$ tries to go below a predetermined voltage. Solving the above equations for this situation results in the equation (17), $$v_o = \frac{-R_2 V_{ref}}{R_1} \qquad (17)$$

This represents the breakpoint between the two circuit conditions. FIG. 4(a) shows an exemplary sinusoidal input waveform input to terminal 22, which is connected to resistor 16 which is, in turn, connected to the inverting input of the operational amplifier 15. A feedback loop is realized between the output of the operational amplifier 15 and is connected between points I and H through resistor 18. The non-inverting input of the operational amplifier 15 is connected to a reference potential 25 through resistor 17. The diode 19 is connected between points H and J. FIG. 4(b) shows the output of the lower limiter wherein the voltage output matches the input for voltages greater than the limiting reference voltage and remains constant for those periods where the input voltage falls below the limiting reference voltage. A maximum voltage limiter is simply the same circuit shown in FIG. 3 but having the diode 19 oriented in the opposite direction.

As shown in the above description, conventional limiter circuits suffer from the same performance inefficiencies as the full-wave rectifier circuit described above.

SUMMARY OF THE INVENTION

In order to overcome the problems described above with respect to the prior art, the present invention relates to a novel operational amplifier configuration that does not require as many extrinsic discrete components in order to realize limiting and rectifying circuits and therefore produces the desired results in a more efficient and cost effective manner. In addition, circuits realized using this new operational amplifier will not be subject to conventional speed limitations since no diodes are needed in the feedback loop.

It is therefore an object of the present invention to provide an operational amplifier having at least two positive inputs and one negative input for use in a variety of electronic circuits, such as, for example, rectifiers, maximum voltage limiters and minimum voltage limiters. Circuits utilizing the operational amplifier of the present invention overcome the deficiencies set forth above with respect to conventional rectifier and limiter circuits.

It is another object of the invention to provide an operational amplifier having three positive inputs and one negative input wherein two of the positive inputs are adapted to receive maximum and minimum limiting reference voltages. An operational amplifier of this type can be used to realize a maximum/minimum voltage limiter circuit.

Another object of the present invention is to provide a full-wave rectifier circuit using an operational amplifier having at least two positive inputs and one negative input.

It is yet another object of the present invention to provide an operational amplifier having at least two positive inputs, one negative input and a correction circuit utilizing four transistors and three independent current sources for use in a full-wave rectifier circuit implementation.

To realize these and other objects and to overcome the deficiencies set forth above with respect to conventional operational amplifier circuits, an operational amplifier in accordance with the invention comprises a differential transistor pair having at least two positive inputs and one negative input wherein the positive input transistors are connected in parallel, having a common drain node connection, the common drain node being connected to one side of a load, the negative input transistor having a drain connected to another side of the load, all of the transistors having a common source node, said common source node being connected to a constant current source. Configurations using this device with a closed feedback loop containing no time sensitive external discrete components connected to the negative input of the operational amplifier provide efficient and effective limiting and rectification without the need for high precision resistor network configurations or diodes that display unacceptable speed limitations.

BRIEF DESCRIPTION OF THE DRAWINGS

This invention will be described in detail with reference to the following drawings in which like reference numerals refer to like elements, and wherein:

FIG. 1 is a circuit diagram of a prior art full-wave rectifier;

FIGS. 2a and 2b are diagrams of input and output signal waveforms which illustrate an input signal and output characteristic respectively of the rectifier shown in FIG. 1;

FIG. 3 is a circuit diagram of a prior art minimum voltage limiting circuit;

FIGS. 4a and 4b are diagrams of input and output signal waveforms which illustrate an input signal and output characteristic respectively of the limiter shown in FIG. 3;

DETAILED DESCRIPTION OF PREFERRED EMBODIMENTS

Figure 5:
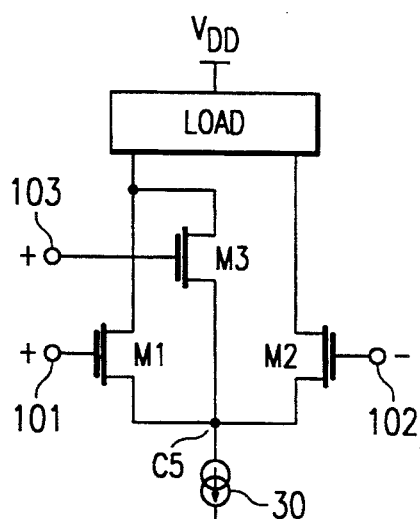
FIG. 5 is a circuit diagram showing the configuration of an operational amplifier input stage according to one aspect of the present invention.
Figure 5A:
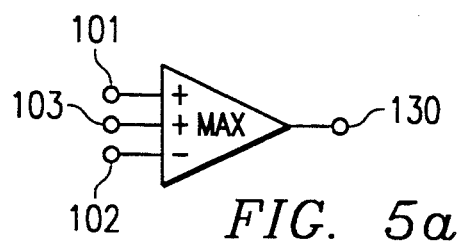
FIG. 5a is a block diagram showing a proposed symbol for a circuit using the configuration shown in FIG. 5.

While this invention is described in detail herein with specific reference to certain illustrated embodiments, there is no intent to be limited to those embodiments. On the contrary, the aim is to cover all modifications, alternatives and equivalents falling within the spirit and scope of the invention as defined by the claims.

To reduce the need for discrete time-dependent extrinsic circuit components, such as, for example, diodes in circuits that use operational amplifiers such as, for example, limiters and rectifiers, and to improve the output characteristics of conventional operational amplifiers, the basic configuration of a conventional two-stage operational amplifier is modified. The modification will be described with reference to FIG. 5 in which an additional positive input transistor M3 is connected in parallel to the usual positive input transistor M1 of the conventional differential input transistor pair comprising a positive non-inverting input transistor M1 and an inverting input transistor M2. The additional positive input transistor M3 is adapted to receive a limiting reference voltage at its gate. The drain of transistor M3 shares a common node with the drain of non-inverting input transistor M1. In addition, the sources of transistors M3, M1 and M2 are connected in a common source node configuration. The common source node C5 is connected to constant current source 30. In addition, the common drain node of transistors M1 and M3 is connected to one side of a load (active or not), such as, for example, a conventional current mirror while the drain of the inverting transistor M2 is connected to the other side of the load. A supply voltage $V_{DD}$ is provided as a power source for the operational amplifier. Transistors M1', M2', M3' of FIG. 6 are connected in the same manner as transistors M1, M2, M3 of FIG. 5, respectively, the only difference being that M1, M2 and M3 are NMOS field effect transistors while M1', M2 and M3' are PMOS field effect transistors.

The operation of the exemplary operational amplifier will be described in detail with reference to FIG. 5b. A sinusoidal input voltage $V_{IN}$ such as that shown in FIG. 5c is connected to the input 101 of the non-inverting transistor M1. A limiting reference voltage $V_{LIM}$ is then applied to the input 103 of the additional positive input transistor M3. A closed feedback loop 120 connects the output 130 at point I to the inverting input 102 of the operational amplifier 110 at the gate of transistor M2. When the input signal falls below the voltage $V_{LIM}$ to which the gate of transistor M3 is connected, transistor M3 becomes active in place of the input transistor Mi. Transistor M3 remains active until the input voltage rises above the reference voltage $V_{LIM}$, at which time the limiting transistor M3 becomes inactive and remains inactive until the threshold is reached again. The effect of the circuit shown in FIG. 5b on the input signal shown in FIG. 5c is shown in FIG. 5d. FIG. 5c shows an ordinary sinusoidal input waveform 40 centered around $V_{RF}$ that is applied to the non-inverting positive input transistor M1. FIG. 5d shows the output of the circuit shown in FIG. 5b. As can readily be seen, the circuit shown in FIG. 5b acts to limit the output of the circuit to values above a certain preset voltage threshold 42 which is $V_{LIM}$. This voltage is the voltage level $V_{LIM}$ applied to the gate of transistor M3. Portions of the input waveform 40 that are above the $V_{LIM}$ threshold 42 remain proportional to the input 40 and are shown by the portion of the waveform denoted 41.

Figure 5B:
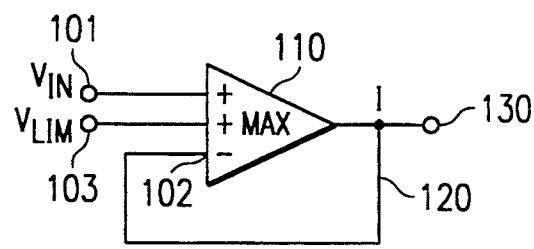
FIG. 5b is a block diagram showing a maximum selector using the operational amplifier input stage shown in FIG. 5.
Figure 5C:
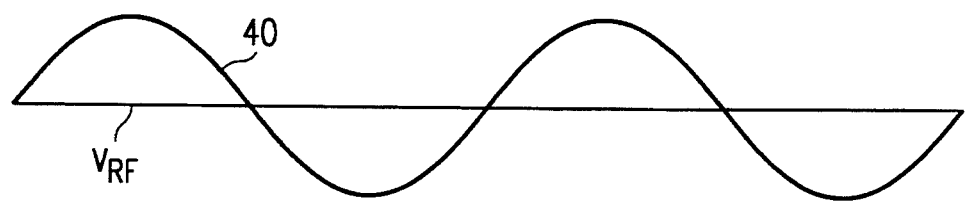
FIG. 5c is an illustration of a sinusoidal input waveform.
Figure 5D:
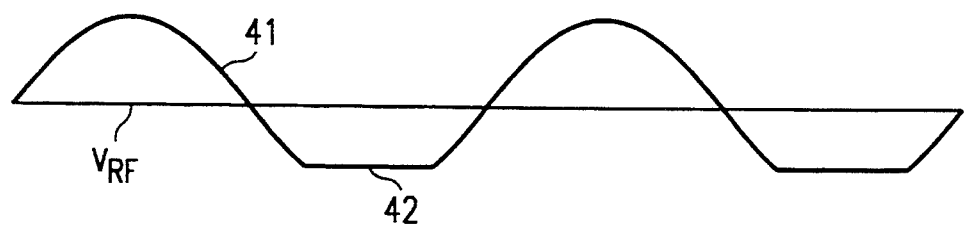
FIG. 5d is an illustration of an output waveform of the circuit shown in FIG. 5b when the input waveform is that shown in FIG. 5c.
Figure 6:
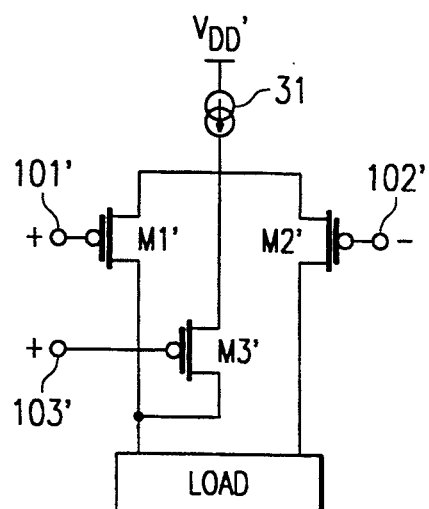
FIG. 6 is a circuit diagram showing an operational amplifier input stage according to another aspect of the present invention.
Figure 6A:
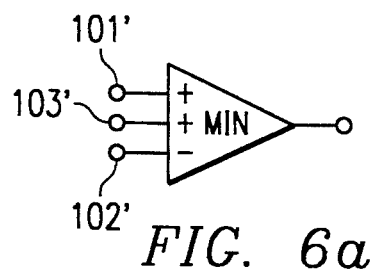
FIG. 6a is a block diagram showing a proposed symbol for a circuit using the configuration shown in FIG. 6.
Figure 6B:
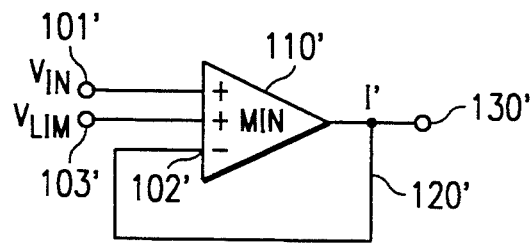
FIG. 6b is a block diagram showing a minimum selector using the operational amplifier input stage shown in FIG. 6.
Figure 6C:
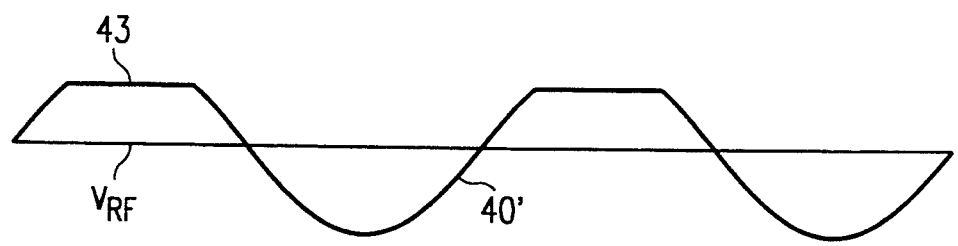
FIG. 6c is an illustration of an output waveform of the circuit shown in FIG. 6b when the input waveform is that shown in FIG. 5c.

FIGS. 6, 6a, 6b and 6c are analogous to what is shown in FIGS. 5, 5a, 5b and 5d, respectively. The difference in the operation of the two circuits is that the transistors utilized in the FIG. 6 configuration are PMOS field effect transistors, whereas the transistors shown in FIG. 5 are NMOS field effect transistors. The effect of the difference in components is that the FIG. 6 implementation provides a minimum selector circuit whereas FIG. 5 implements a maximum selector. Using the sinusoidal input waveform shown in FIG. 5c, FIG. 6c shows the output of the circuit described in FIG. 6b. In the circuit shown in FIG. 6b, when the input voltage $V_{IN}$ rises above the reference voltage $V_{LIM}$ to which the gate transistor M3' is connected, transistor M3' becomes active in place of input transistor M1' and remains active until the input voltage falls below the reference voltage $V_{LIM}$. The resulting output is shown in FIG. 6c. FIG. 6b is an example of a minimum selector circuit according to an aspect of the present invention.

Another very important implementation, using the maximum selector circuit shown in FIG. 5 as a basic building block, is the construction of a full-wave rectifier circuit. In the preferred full-wave rectifier embodiment, shown in FIG. 8a, a full-wave rectifier is advantageously realized using either of the operational amplifier input stages shown in FIGS. 5 and 8. The maximum selector circuit shown in FIG. 8a follows, in closed-loop, the higher of $V_{IN}$ and $V_{RF}$, where $V_{RF}$ is the DC center point of the sinusoidal input signal shown in FIG. 7c. The feedback loop is defined by the resistor network between the output 130 of the maximum selector 140, the inverting input 102 and the input voltage $V_{IN}$ terminal 101. Resistors R1 and R2 are connected in series between the non-inverting input 101 and the output 130 with a lead connecting the inverting terminal 102 to the common node of resistors R1 and R2. In this example R1=R2, therefore the gain is unity. However R1 and R2 can be selected to realize other than unity gain if desired.

Figure 7C:
FIG. 7c is an illustration of a sinusoidal input waveform.
Figure 8:
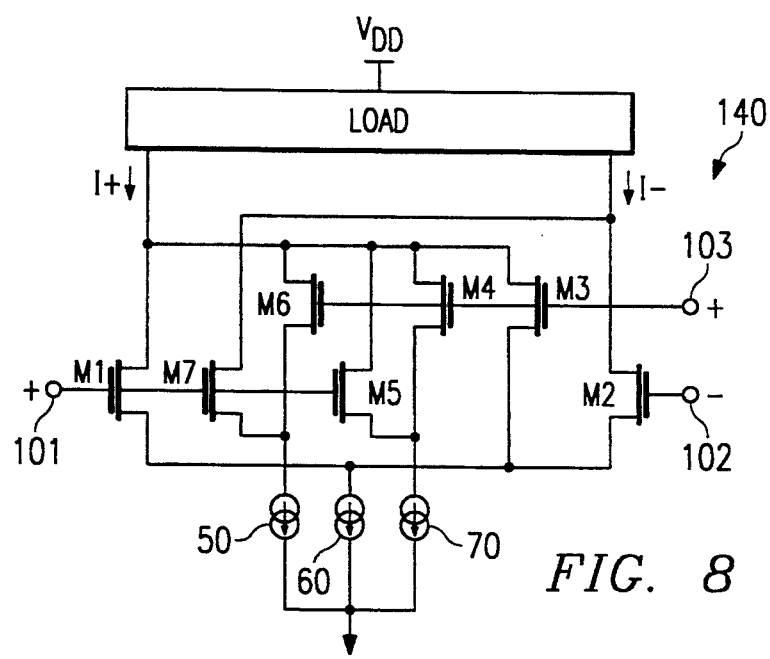
FIG. 8 is an operational amplifier input stage according to one aspect of the present invention.
Figure 8A:
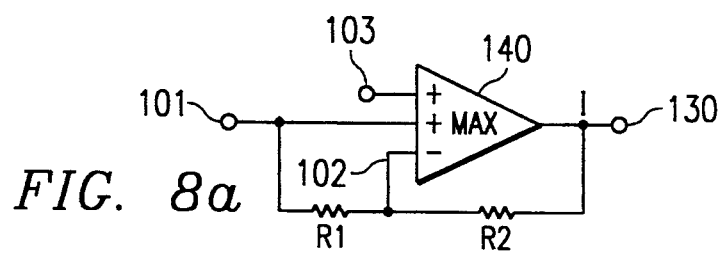
FIG. 8a is a block circuit diagram implementing a full-wave rectifier using an operational amplifier having an input stage shown in either FIG. 5 or FIG. 8.

When $V_{IN}$ is positive, i.e., larger than $V_{RF}$, only the positive input transistor M1 connected to $V_{IN}$ is active since it is connected to a voltage that is higher than the reference voltage $V_{RF}$. In this condition, the amplifier 140 acts as a unity gain follower stage. Consequently, the output voltage $V_{OUT}$ at 130 is equal to the input voltage $V_{IN}$ for positive half-waves (i.e., $V_{IN}=V_{OUT}$). For negative half-waves, i.e., where $V_{IN}<V_{RF}$, only the positive input transistor M3 connected to $V_{RF}$ is active. The output then follows $V_{IN}$ with a signal inversion since the amplifier in this portion of the input signal $V_{IN}$ acts as an inverting stage having a gain of $-1$. Therefore, for negative half-waves, $V_{OUT}=-V_{IN}$. So, when an input waveform as shown in FIG. 7c is input to terminal 101 of the circuit shown in FIG. 8a, and the reference voltage $V_{RF}$ is connected to the input terminal 103, the output is a fully rectified sine wave as shown in FIG. 8c.

However, a small offset error is introduced when both positive inputs 101, 103 are equal, i.e., at zero crossings of the sinusoidal input wave where $V_{RF}=V_{IN}$. This offset error is due to the parallel connections of M1 and M3 on the positive side being equivalent to a positive input transistor having twice the size of the negative input transistor M2. To compensate for this offset, as shown in FIG. 8, a correction circuit is added to the basic maximum selector comprising transistors M4, M5, M6 and M7 wherein transistors M4 and M7 are twice as large as the remaining transistors M1, M2, M3, M5 and M6. Transistors M4 to M7 are connected at their sources to constant current sources 50 and 70 respectively having a current half as large as the constant current source 60. Constant current source 60 provides a biasing current for transistors M1, M2 and M3.

With this correction circuit implemented, the following calculations show how the offset error is corrected.

The zero crossing operation of the circuit is then defined as follows:

$$I- = I_2+I_4+I_7 = I/3+I/3+I/3 = I \quad (18)$$
$$I+ = I_3+I_1+I_5+I_6 = I/3+I/3+I/6+I/6 = I \quad (19)$$

For left positive input at M1 much greater than right positive input M3:

$$I- = I_2+I_4+I_7 = I/2+I/2+0 = I \quad (20)$$
$$I+ = I_3+I_1 I_5+I_6 = I/2+0+0+I/2 = I \quad (21)$$

For left positive input at M1 much less than right positive input at M3:

$$I- = I_2+I_4+I_7 = I/2+0+I/2 = I \quad (22)$$
$$I+ = I_3+I_1+I_5+I_6 = 0+I/2+I/2+0 = I \quad (23)$$

Hence, $I+ = I-$ in all situations thereby correcting any small offset error that may occur when both positive inputs are equal. This correction is only accurate when positive inputs M1 and M3 are equal or very different. It is inaccurate in the intermediate range and therefore should only be used in full-wave rectifier implementations. This is due to the fact that the circuit implements an approximation of the total transconductance given by the three main devices M1, M2 and M3 and is inexact outside the extreme ranges (i.e., both positive inputs are equal or where one positive input is much greater than the other and vice versa).

Figure 8B:
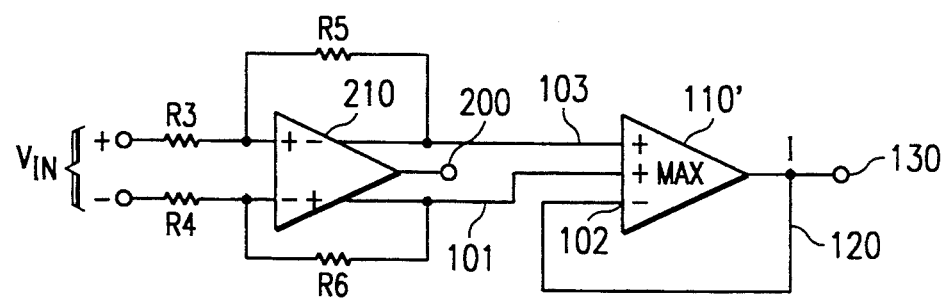
FIG. 8b is block circuit diagram showing a two stage full-wave rectifier using a conventional fully differential operational amplifier as the first stage and the maximum selector shown in FIG. 5b.
Figure 8C:
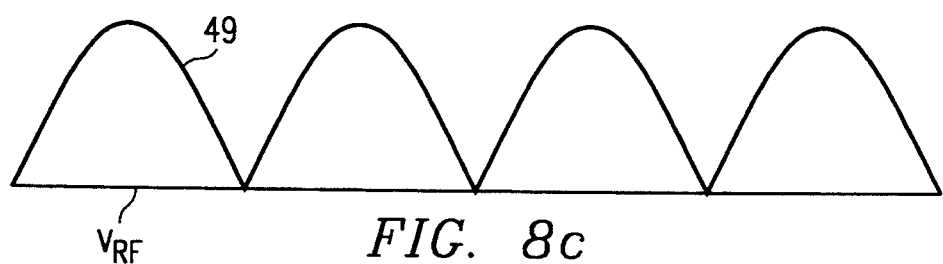
FIG. 8c is an illustration of an output waveform of either of the circuits shown in FIGS. 8a or 8b when the input waveform is that shown in FIG. 7c.

FIG. 8b shows a full-wave rectifier circuit using a two stage configuration having a first stage 210 that is a conventional fully differential operational amplifier that generates two complementary signals with an exact phase shift of 180° centered about a voltage at 200 from a sinusoidal input waveform, i.e., a differential follower circuit. The output signals from 210 are then buffered via the maximum selector 110' corresponding to the maximum selector shown in FIG. 5. The maximum selector 110' provides only positive half-waves to the output 130 of the circuit. The maximum selector 110' selects the higher of the two inputs as described above with respect to the operation of the operational amplifier shown in FIG. 5. The output waveform shown in FIG. 8c is the same as that produced by the circuit shown in FIG. 8a, when using a sinusoidal input waveform centered about $V_{RF}$ as shown in FIG. 7c.

Limiting a signal between two values, i.e., maximum and minimum, can be achieved by a combination of the minimum and maximum selector configurations discussed above. Combining the basic maximum and minimum selector functions in the same input stage results in a circuit that operates similar to rail-to-rail operational amplifier input configurations.

Figure 7:
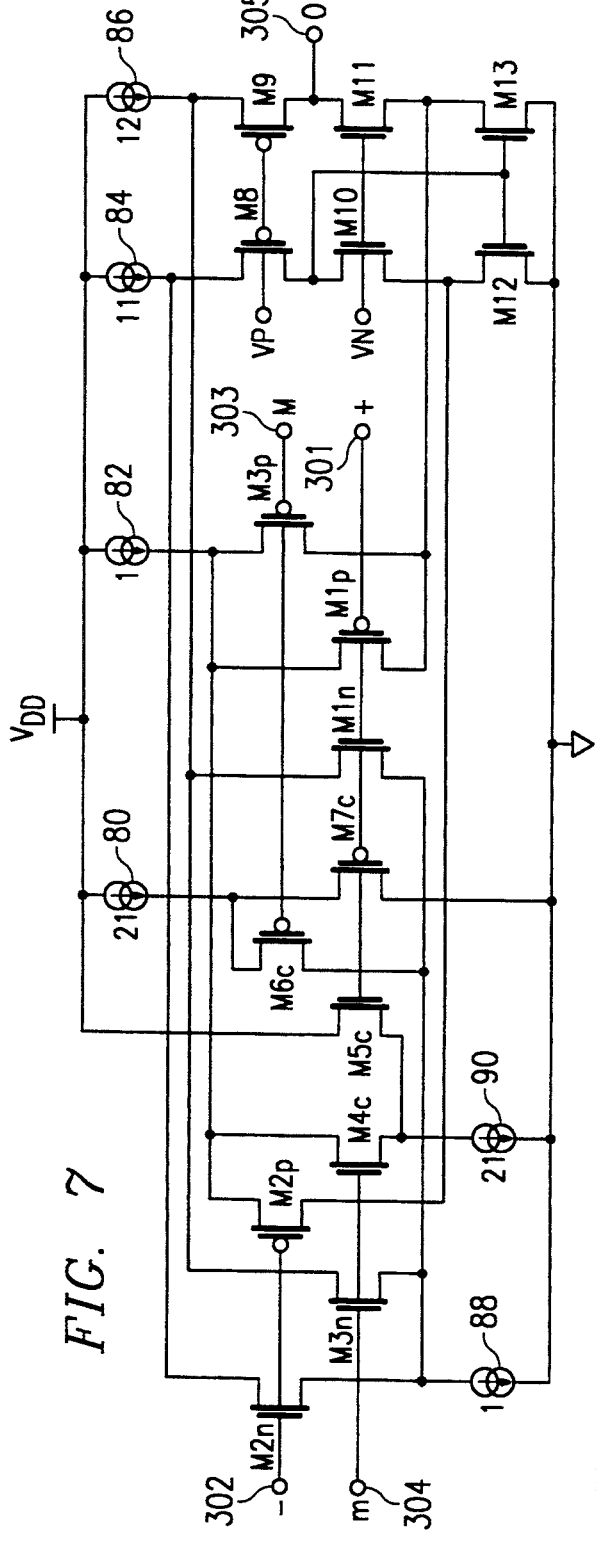
FIG. 7 is a circuit diagram showing an operational amplifier input stage according to another aspect of the present invention wherein there are at least three positive inputs and one negative input.

FIG. 7 shows an input stage for the maximum/minimum signal limiter discussed above. In this configuration, the NMOS input pair M1n, M2n is completed with an additional input transistor M3n, while the PMOS input pair M1p, M2p is completed with an additional input transistor M3p. These two modified "pairs", i.e. M1n M2n, M3n and M1p, M2p, M3p, are connected at their drains to a folded-cascode current differencing scheme comprising transistors M8, M9, M10, M11, M12 and M13. The folded-cascode circuit transistors M8, M9, M10, M11, M12, M13 are biased by current sources 84 and 86, and voltage sources VP and VN. The output node 305 of the gain stage must be connected to a second gain stage for a two-stage operational amplifier configuration.

The input stage, as described above, implement a minimum and maximum selecting functions, represented by the PMOS input pair and NMOS input pair respectively, in the same input stage. Therefore, the output in closed-loop will follow the input signal between the minimum and maximum values m and M connected to nodes 304 and 303, respectively. The output will be clamped for values outside the minimum/maximum window defined by m and M. The function of each stage is described above with respect to FIGS. 5 and 6. For example, when $m < V_{IN} < M$, only M1n and M1p are active while M3n and M3p are inactive. When $V_{IN} > M$, M1p is inactive and M3p conducts. When $V_{IN} > m$, M3n conducts while M1n is inactive.

To ensure that the two main pairs are not simultaneously active when one of the limiting voltages is reached, for example, M1n, M2n (NMOS pair) and M3p, M2p (PMOS pair) when $V_{IN} > M$, two additional transistor pairs are added to the circuit. The pairs are made up of M4c, M5c and M6c, M7c. These pairs function by subtracting a current 2I 80,90, where 2I 80,90 is larger than the main pairs bias current I 82,88, from the non-clamping differential pair (M1n, M2n in this example when $V_{IN} > M$), in such a way that this pair is deactivated just before the clamping device M3p enters conduction. For example, when $V_{IN} > M$, the PMOS pair M3p, M2p conducts. NMOS pair M1n, M2n is deactivated since current 2I flows through M6c and draws all the current away from the NMOS input transistors M1n, M2n, M3n. Choosing 2I larger than I amounts to introducing a small voltage margin that guarantees non-conduction of the non-clamping pair over a small range of the input voltage just before clamping. This configuration, therefore, avoids conflicting conduction of the two input pairs that are set at different voltages.

Figure 7D:
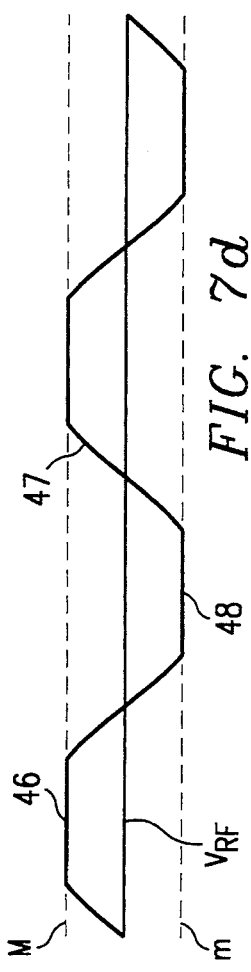
FIG. 7d is an illustration of an output waveform of the circuit shown in FIG. 7b when the input waveform is that shown in FIG. 7c.
Figure 7A:
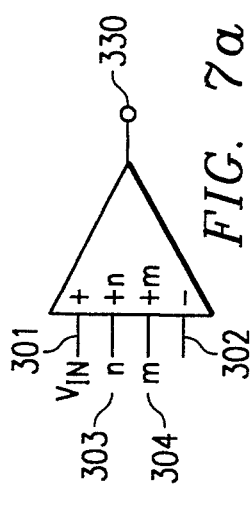
FIG. 7a is a block diagram showing a proposed symbol for the circuit shown in FIG. 7.

FIG. 7a shows a block diagram of the minimum/maximum limiter circuit shown in FIG. 7, where inputs 301, 302, 303, 304 are connected to the gates of the input transistors. Output lead 330 is connected to the output of the second gain stage of the window limiter that includes the input stage shown in FIG. 7.

Figure 7B:
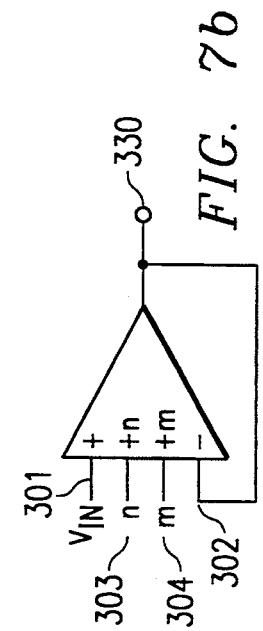
FIG. 7b is a block diagram showing a minimum/maximum limiter (or window limiter) using the operational amplifier input stage shown in FIG. 7.

FIG. 7b is an example of how a minimum/maximum limiter circuit is realized. $V_{IN}$ is connected to 301 while the maximum limiting voltage $V_{LIMMAX}$ and the minimum limiting voltage $V_{LIMMIN}$ are connected to 303 and 304, respectively. The inverting input 302 is connected to a feedback loop 320 from the output 330. The output of the configuration shown in FIG. 7b when a sinusoidal input voltage shown in FIG. 7c is applied to $V_{IN}$ (301), is the waveform shown in FIG. 7d where 46 represents the $V_{LIMMAX}$, M and 48 represents the $V_{LIMMIN}$, m, the portion of the input waveform that is not affected by the circuit 47 is that portion below $V_{LIMMAX}$ (M) and above $V_{LIMMIN}$ (m).

Implementing circuits using the operational amplifier input stage configurations described above provides many advantages over prior art operational amplifier circuits. These advantages include, but are not limited to, high accuracy signal limiting or rectification; simplicity of use, operation and function; reduction in the number of required components; reduced speed limitations since there are no diodes required in feedback loops; comparators or switching circuits are not required for sensing the polarity of the input signal (thereby eliminating any delays associated with these components); the speed of the circuit is that of the operational amplifier; and the ability to operate under low supply voltage conditions with high voltage swings.

It is noted here that all configurations discussed above show amplification stages having unity gain. That gain can be increased by implementing feedback resistors around the basic maximum and minimum selectors thereby modifying the values of the limiting thresholds or the output amplitude.

In addition, the configurations discussed above specified MOS field effect transistors (MOSFETs). It should be noted, however that bipolar transistors can be used in place of the MOSFETs specified to reach the same results provided the base emitter junctions can sustain reverse biasing under a given voltage swing. This is not a problem in low-supply circuits.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limited. Various changes may be made without departing from the spirit and scope of the invention as defined in the following claims.

What is claimed is:

1. An operational amplifier, comprising:
   a load;
   a constant current source;
   at least two positive input transistors, each having a conduction path connected on a first end in common with one another and to a first side of said load, and connected on a second end in common with one another and to said constant current source, each of said at least two positive input transistors having a control electrode for receiving a positive input signal; and
   a negative input transistor having a conduction path connected on a first end to a second side of said load and connected on a second end in common with the second ends of said at least two positive input transistors and to said constant current source, and having a control electrode for receiving a negative input signal.

2. The operational amplifier of claim 1, wherein said at least two positive input transistors are NMOS field effect transistors, having a common drain node connected to the first side of said load and having a common source node connected to said constant current source;
   and wherein said negative input transistor is a NMOS field effect transistor having its drain connected to the second side of said load and having its source connected in common with the sources of said at least two positive input transistors to said constant current source.

3. The operational amplifier of claim 1, wherein said at least two positive input transistors are PMOS field effect transistors having a common drain node connected to the first side of said load and having a common source node connected to said constant current source;
   and wherein said negative input transistor is a PMOS field effect transistor having its drain connected to the second side of said load and having its source connected in common with the sources of said at least two positive input transistors to said constant current source.

4. The operational amplifier of claim 1, wherein said at least two positive input transistors and said negative input transistor are bipolar transistors.

5. An operational amplifier, comprising:
   a first positive input transistor adapted to receive a first input signal;
   a second positive input transistor adapted to receive a second input signal;
   a negative input transistor adapted to receive an inverting input signal; and
   said first positive input transistor and said second positive input transistor having a common drain node connected to a first side of a load, a drain of said negative input transistor being connected to a second side of said load, said first and second positive input transistors and said negative input transistor having a common source node being connected to a first constant current source.

6. The operational amplifier of claim 5, further comprising a correction circuit, said correction circuit, comprising:
   fourth, fifth, sixth and seventh transistors, said fourth and seventh transistors being twice as large as said fifth and sixth transistors, said fifth and sixth transistors being the same size as said first and second positive input transistors and said negative input transistor;
   said first positive input transistor, said seventh transistor and said fifth transistor having a common gate node connected to said first input signal;
   said second positive input transistor, said fourth transistor and said sixth transistor having a common gate node connected to said second input signal;
   said negative input transistor, said seventh transistor and said fourth transistor having a common drain node connected to said second side of said load;
   said first positive input transistor, said second positive input transistor, said fifth transistor and said sixth transistor having a common drain node connected to said first side of said load;
   said fourth and said fifth transistors having a common source node connected to a second constant current source, said second constant current source providing a current half as large as a current supplied by said first constant current source; and
   said sixth transistor and seventh transistor having a common source node connected to a third constant current source, said third constant current source having a current one half as large as a current supplied by said first constant current source.

7. The operational amplifier of claim 6, wherein said first positive input transistor, said second positive input transistor, said negative input transistor, said fourth transistor, said fifth transistor, said sixth transistor and said seventh transistor are NMOS field effect transistors.

8. The operational amplifier of claim 6, wherein said first positive input transistor, said second positive input transistor, said fifth transistor, said sixth transistor and said seventh transistor are PMOS field effect transistors.

9. The operational amplifier of claim 6, wherein said first positive input transistor, said second positive input transistor, said negative input transistor, said fourth transistor, said fifth transistor, said sixth transistor and said seventh transistor are bipolar transistors.

10. The operational amplifier of claim 6, further comprising:
    an output stage connected to said load;

said second input signal being a DC voltage center point of said first input signal;

said first input signal being a sinusoidal voltage input waveform; and a feedback loop connecting said output of said operational amplifier being connected to a first end of a first resistor, a second end of said first resistor being connected to a gate of said negative input transistor and a first end of a second resistor, a second end of said second resistor being connected to said gate of said first positive input transistor.

11. The operational amplifier of claim 5, wherein said first positive input transistor, said second positive input transistor and said negative input transistor are NMOS field effect transistors.

12. The operational amplifier of claim 5, wherein said first positive input transistor, said second positive input transistor and said negative input transistor are PMOS field effect transistors.

13. The operational amplifier of claim 5, wherein said first positive input transistor, said second positive input transistor and said negative input transistor are bipolar transistors.

14. The operational amplifier of claim 5, further comprising:

an output stage connected to said load;

said first input signal connected to a gate of said first positive input transistor;

said second input signal connected to a gate of said second positive input transistor, said second input signal being a reference voltage, said reference voltage providing a predetermined threshold voltage for limiting an output of said operational amplifier; and said output of said operational amplifier having a feedback connection to a gate of said negative input transistor.

15. An electronic circuit, comprising:

an operational amplifier having an input stage and an output stage, wherein said input stage comprises, a first positive input transistor adapted to receive a first positive input signal, a second positive input transistor adapted to receive a second input signal, and a negative input transistor adapted to receive an inverting input signal, said first positive input transistor and said second positive input transistor having a common drain node connected to a first side of a load, a drain of said negative input transistor being connected to a second side of said load, said first and second positive input transistors and said negative input transistor having a common source node connected to a first constant current source, said output stage connected to said load for providing an output signal of said electronic circuit device;

said first input signal connected to a gate of said first input transistor;

said second input signal connected to a gate of said second input transistor, said second input signal being a reference voltage providing a predetermined threshold voltage for limiting an output signal of said operational amplifier; and said output of said operational amplifier being connected via a feedback connection to a gate of said negative input transistor.

16. The electronic circuit device of claim 15, wherein said first positive input transistor, said second positive input transistor and said negative input transistor are NMOS field effect transistors.

17. The electronic circuit device of claim 15, wherein said first positive input transistor, said second positive input transistor and said negative input transistor are PMOS field effect transistors.

18. The electronic circuit device of claim 15, wherein said first positive input transistor, said second positive input transistor and said negative input transistor are bipolar transistors.

19. The electronic circuit of claim 15, further comprising a correction circuit, said correction circuit comprising:

fourth, fifth, sixth and seventh transistors, said fourth and seventh transistors being twice as large as said fifth and sixth transistors, said fifth and sixth transistors being the same size as said first and second positive input transistors and said negative input transistor;

said second positive input transistor, said fourth transistor and said sixth transistor having a common gate node connected to said second input signal;

said first positive input transistor, said seventh transistor and said fifth transistor having a common gate node connected to said first input signal;

said negative input transistor, said seventh transistor and said fourth transistor having a common drain node connected to said second side of said load;

said first positive input transistor, said second positive input transistor, said fifth transistor and said sixth transistor having a common drain node connected to said first side of said load;

said fourth and said fifth transistors having a common source node connected to a second constant current source, said second constant current source providing a current half as large as a current supplied by said first constant current source; and said sixth transistor and seventh transistor having a common source node connected to a third constant current source, said third constant current source having a current one half as large as a current supplied by said first constant current source.

20. The electronic circuit of claim 19, wherein:

said first input signal is a sinusoidal input waveform having a DC center point voltage;

said second input signal is equal to said DC center point voltage; and said feedback connection connecting said output of said operational amplifier to a first end of a first resistor, a second end of said first resistor being connected to said gate of said negative input transistor, said second end of said first resistor also being connected to a first end of a second resistor, a second end of said second resistor being connected to said gate of said first positive input transistor.

21. The electronic circuit device of claim 20, wherein said first resistor and said second resistor have equal values.

22. The electronic circuit of claim 20, wherein said electronic circuit is a full-wave rectifier.

23. The operational amplifier of claim 19, wherein said first positive input transistor, said second positive input transistor, said negative input transistor, said fourth transistor, said fifth transistor, said sixth transistor and said seventh transistor are NMOS field effect transistors.

24. The operational amplifier of claim 19, wherein said first positive input transistor, said second positive input transistor, said negative input transistor, said fourth transistor, said fifth transistor, said sixth transistor and said seventh transistor are PMOS field effect transistors.

25. The operational amplifier of claim 19, wherein said first positive input transistor, said second positive input transistor, said negative input transistor, said fourth transistor, said fifth transistor, said sixth transistor and said seventh transistor are bipolar transistors.

26. An electronic circuit, comprising:
a first input terminal adapted to receive a first input signal, said first input terminal being connected to a gate of a first, second, third and fourth transistors;
a second input terminal adapted to receive a second input signal, said second input terminal being connected to a gate of a fifth and sixth transistor;
a third input terminal adapted to receive a third input signal, said third input terminal being connected to a gate of a seventh and eighth transistor;
a fourth input terminal adapted to receive a fourth input signal, said fourth input terminal being connected to a gate of a ninth and tenth transistor;
a fifth input terminal adapted to receive a first biasing voltage, said fifth input terminal being connected to a gate of an eleventh and twelfth transistor;
a sixth input terminal adapted to receive a second biasing voltage, said sixth input terminal being connected to a gate of a thirteenth and fourteenth transistor;
a source of said first transistor being connected to a first constant current source and a drain of said first transistor being connected to a source of said eleventh transistor;
a drain of said second transistor being connected to a fourth constant current source and a source of said second transistor being connected to a fifth constant current source;
a source of said third transistor being connected to a second constant current source wherein said second constant current source supplies a current greater than a current supplied by said first constant current source, and a drain of said third transistor being connected to ground;
a drain of said fourth transistor being connected to a constant supply voltage and a source of said fourth transistor being connected to a source of said eighth transistor;
a drain of said fifth transistor being connected to a third constant current source and a source of said fifth transistor being connected to a fifth constant current source;
a source of said sixth transistor connected to said first constant current source and a drain of said sixth transistor being connected to a source of said twelfth transistor;
a drain of said seventh transistor being connected to said fourth current source and a source of said seventh transistor being connected to said fifth current source;
a drain of said eighth transistor being connected to said first current source and a source of said eighth transistor being connected to a sixth current source wherein said sixth current source supplies a current greater than a current supply by said fifth constant current source;
a source of said ninth transistor being connected to said first constant current source and a drain of said ninth transistor being connected to the source of said fourteenth transistor;
a source of said tenth transistor being connected to said constant current source and a drain of said tenth transistor being connected to said fifth constant current source;
a source of said eleventh transistor being connected to said third constant current source and a drain of said eleventh transistor being connected to a drain of said thirteenth transistor;
a drain of said twelfth transistor being connected to said fourth constant current source and a source of said twelfth transistor being connected to a drain of said fourteenth transistor;
a drain of said thirteenth transistor being connected to a drain of said eleventh transistor and a source of said thirteenth transistor being connected to a drain of said fifteenth transistor;
a drain of said fourteenth transistor being connected to a source of said twelfth transistor and a source of said fourteenth transistor being connected to a drain of said sixteenth transistor;
a drain of said fifteenth transistor being connected to a source of said thirteenth transistor and a source of said fifteenth transistor being connected to ground;
a drain of said sixteenth transistor being connected to a source of said fourteenth transistor and a source of said sixteenth transistor being connected to ground; and
an output terminal adapted for connection to one of a source of the twelfth transistor or a drain of the fourteenth transistor.

* * * * *